United States Patent [19]

Kimura et al.

[11] Patent Number: 5,634,586
[45] Date of Patent: Jun. 3, 1997

[54] SINGLE POINT BONDING METHOD

[75] Inventors: Kazumasa Kimura, Tokyo; Yasushi Suzuki, Oume, both of Japan

[73] Assignee: Kabushiki Kaisha Shinkawa, Tokyo, Japan

[21] Appl. No.: 561,402

[22] Filed: Nov. 21, 1995

[30] Foreign Application Priority Data

Nov. 25, 1994 [JP] Japan ................... 6-314283

[51] Int. Cl.⁶ ........................................... H01L 21/607
[52] U.S. Cl. ..................... 228/110.1; 228/111; 228/212
[58] Field of Search ..................... 228/110.1, 111, 228/212, 1.1, 4.5, 44.7

[56] References Cited

U.S. PATENT DOCUMENTS

| | | | |
|---|---|---|---|
| 3,934,783 | 1/1976 | Larrison | 228/110.1 |
| 4,422,568 | 12/1983 | Elles et al. | 228/180.5 |
| 4,619,397 | 10/1986 | Urban | 228/4.5 |
| 4,998,002 | 3/1991 | Okikawa et al. | 228/4.5 |

FOREIGN PATENT DOCUMENTS 2-299247   12/1990   Japan .

OTHER PUBLICATIONS pp. 215–223 of "TAB Gijutsu Nyumon [Introduction to TAB Techniques]", written by Kenzo Hatada and issued by Kogyo Chosakai in Jan., 1990.

*Primary Examiner*—Samuel M. Heinrich
*Attorney, Agent, or Firm*—Koda and Androlia

[57] ABSTRACT

A single point bonding method used in individually bonding, for example, the leads of a pad of a chip to a pad of a circuit board, including the steps of forming a pressure scar at the free end of each lead by a bonding tool, catching the irregular portions of the thus made pressure scar by the end of the bonding tool so as to move the free end of the lead towards its fixed end and then bonding the lead to a corresponding pad.

4 Claims, 3 Drawing Sheets

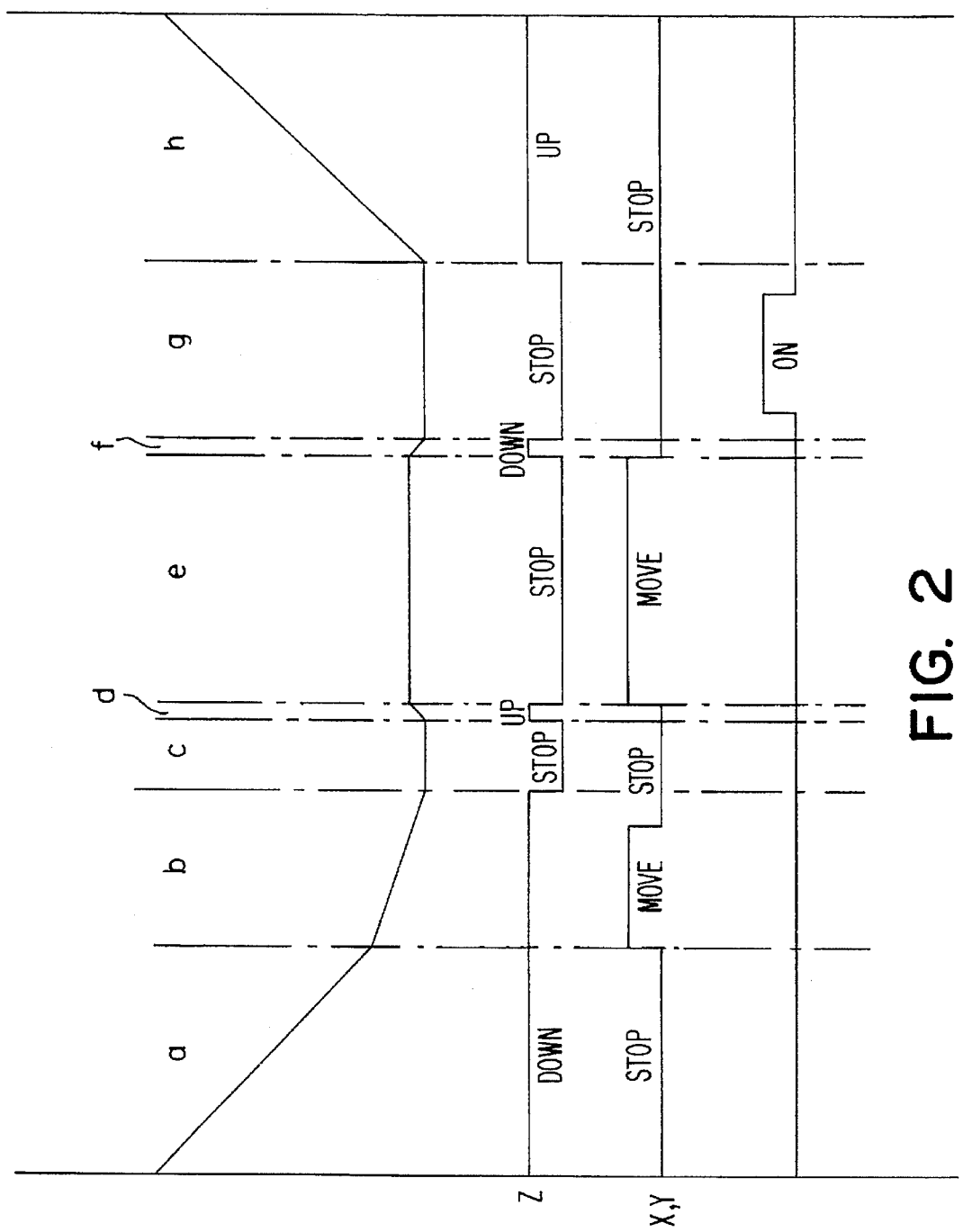

SINGLE POINT BONDING METHOD

BACKGROUND OF THE INVENTION

1. Field of the Invention

The present invention relates to a single point bonding method in which leads connected to pad (electrodes) of a chip (semiconductor elements) are individually connected to pads on a circuit board or in which leads of chips are individually connected to pads of chips.

2. Prior Art

The packaging of semiconductor elements is accomplished, for example, in the following manner:

As shown in FIG. 5(a), leads 2 of a chip 1 are connected to the pads 4 of a chip 3, the leads 2 are cut to a prescribed length, and then each lead 2 is formed into a stress-absorbing shape. As shown in FIG. 5b, the respective leads 2 attached to the chips 3 are individually connected to corresponding pads 6 of a circuit board 5 by a bonder using heat-and-pressure bonding in combination with ultrasonic waves.

The shaping of the leads 2 as referred to above is done in order to absorb the stress which is caused by the difference in thermal expansion between the chip 3 and the circuit board 5 and also in order to alleviate the stress occurring during electrical testing and packaging. Packaging configurations of this type are described on page 215–223 of "TAB Gijutsu Nyumon [Introduction to TAB Techniques]" written by Kenzo Hatada and issued by Kogyo Chosakai. In addition, a single point bonding method in which respective leads are individually connected to respective pads is described in, for example, Japanese Patent Application Laid-Open (Kokai) No. 2-299247.

In the prior art described above, it is necessary to use a shaping die for accomplishing the shaping of the leads 2, which increases equipment expenditures and the number of processes required in semiconductor assembling, resulting in increased cost. Furthermore, in the conventional single point bonding method described above, the leads 2 are merely bonded by applying ultrasonic waves thereto with a load being applied to the leads 2 by way of lowering a bonding tool to press each lead 2 against the corresponding pad 6. In this method, therefore, the leads 2 are not formed into a shape that can absorb the stress.

SUMMARY OF THE INVENTION

Accordingly, the object of the present invention is to provide a single point bonding method which is able to accomplish bonding with the leads formed into a stress-absorbing shape.

The object of the present invention is accomplished by unique steps which are taken in a single point bonding method wherein leads connected to pads of chips are individually connected to pads of circuit boards by means a bonding tool or wherein leads of chips are individually connected to pads of chips by a bonding tool, and the unique steps of the present invention are that: a pressure scar is formed on the free end portion of each lead by the bonding tool, the bonding tool catches on the irregular portions of the thus formed pressure scar and moves the free end portion toward the fixed end of the lead, and then the bonding of the lead is performed to the pad of a circuit board or the pad of a chip.

In the method of the present invention, after the pressure scar is formed on each lead by the bonding tool, the bonding tool is then moved toward the fixed end of the lead by catching on the irregular portions of the pressure scar, thus deforming the lead from a tightly stretched state into substantially an "S" shape, which has a certain degree of slack. The lead is then bonded in this deformed shape.

BRIEF DESCRIPTION OF THE DRAWINGS

FIG. 2 (a) through 2 (h) represent a timing chart of the vertical movement (Z) of the bonding tool, XY movement of the bonding tool and the oscillation of the ultrasonic waves (US);

FIG. 4 shows another example of the lower end of the bonding tool, wherein FIG. 5 illustrates an example of an LSI package, wherein

DETAILED DESCRIPTION OF THE INVENTION

Figure 1A:
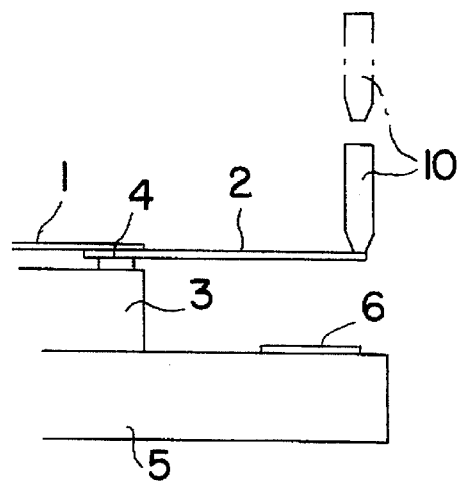
FIGS. 1(a) through 1(h) are explanatory diagrams which illustrate the operation steps of one embodiment of the single point bonding method of the present invention.

One embodiment of the present invention will be described with reference to FIGS. 1 through 4. Elements which are the same as those in FIG. 5 or which correspond to those in FIG. 5 are labeled with the same symbols as in FIG. 5, and a detailed description of such elements is omitted.

In FIG. 1, the reference numeral 10 indicates a bonding tool of a known bonder which uses ultrasonic waves and heat-and-pressure bonding in combination. This tool 10 is attached to a horn (not shown) and is held on a bonding head (not shown) so that the horn can be moved upward and downward. The bonding head 10 is mounted on an XY table (not shown).

Figure 3A:
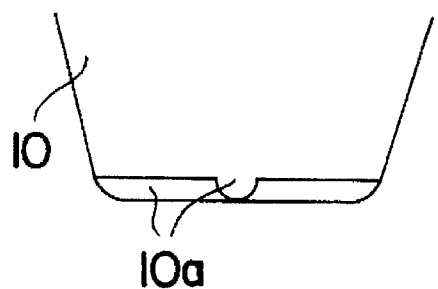
FIG. 3 shows the lower end of one example of the bonding tool, wherein FIG. 3 (a) is a front view thereof.
FIG. 3(b) is a bottom view thereof.
Figure 3B:
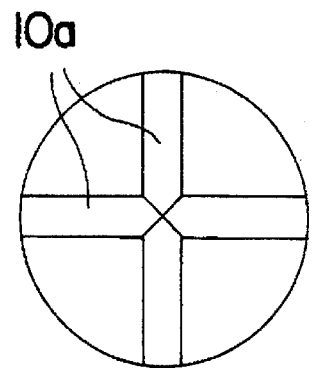
Figure 4A:
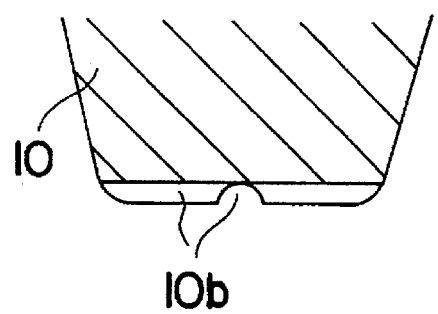
FIG. 4(a) is a sectional view thereof.
Figure 4B:
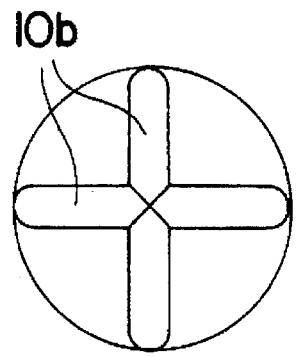
FIG. 4(b) is a bottom view thereof.
Figure 5A:
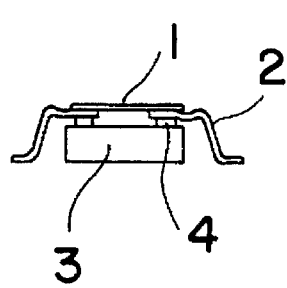
FIG. 5(a) is a side view of leads attached to a chip.
Figure 5B:
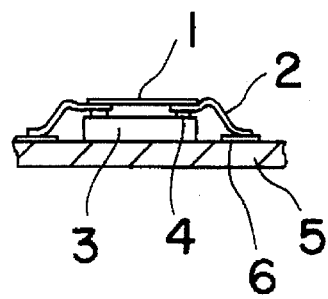
FIG. 5(b) is a side view of the leads bonded to a circuit board.

In the present embodiment, as shown in FIG. 3 and FIG. 4, respectively, the tool 10 is provided with a cross-form projection 10a or cross-form groove 10b formed on the undersurface. The projection 10a or the groove 10b is not limited to a cross shape, and it is possible to form both a projection and a groove.

Next, the bonding method will be described with reference to FIGS. 1 and 2.

First, as shown in FIG. 1(a) and FIG. 2(a), the tool 10 is lowered onto a lead 2 from above.

When the tool 10 contacts the free end 2A of the lead 2, the tool 10 continues to move downward in a movement more gradual than the lowering speed while pressing the lead 2 downward. In addition, the tool 10 also moves in the X–Y directions along a circular arc which causes the lead 2 to bend from its fixed end 2B as shown in FIG. 1(b) and FIG. 2(b).

Figure 1E:
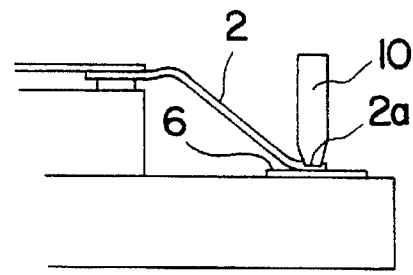
Figure 1B:
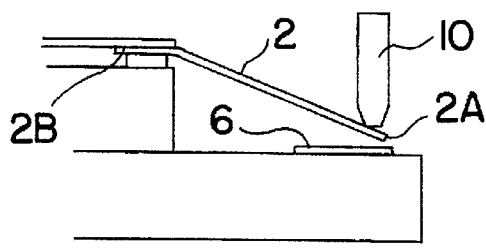
Figure 1F:
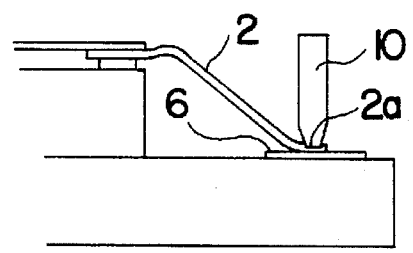
Figure 1C:
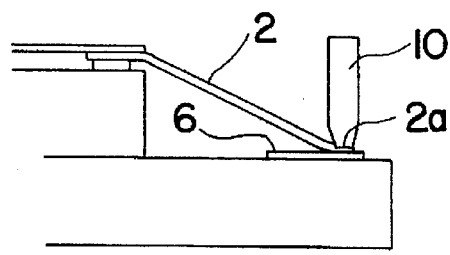

As a result of the lowering of the tool 10, the lead 2 contacts the pad 6; and with the load applied to the tool 10, a pressure scar 2(a) which corresponds to the shape of the undersurface of the tool 10 is formed in the lead 2 as shown in FIG. 1(c) and FIG. 2(c). Thus, the free end portion 2A is formed with an uneven pattern thereon. The depth of this pressure scar 2a (i.e., the amount of crushing of the lead 2) is approximately 10 μm.

Figure 1G:
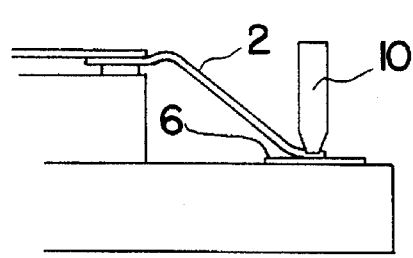
Figure 1D:
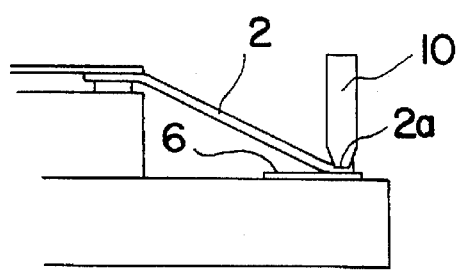

After the tool 10 is temporarily stopped, it is raised by a distance (e.g., approximately 5μm) which is within the depth of the pressure scar 2a marked on the lead 2 as shown in FIG. 1(d) and FIG. 2(d). In other words, the tool 10 is in a state catching on the scar 2a with its uneven under surface.

Next, as shown in FIG. 1(e) and FIG. 2(e), the tool 10 is moved toward the fixed end 2B of the lead 2 or to the left side in FIG. 1(e). More specifically, the tool 10 catching on the irregular portions of the pressure scar 2a is moved so that the free end 2A of the lead 2 is moved toward its fixed end 2B. As a result, the lead 2 is deformed from a tightly stretched state as seen in FIG. 1(d) into a shape similar to "S" as shown in FIG. 1(e), which has a certain degree of slack.

Next, as shown in FIG. 1(f) and FIG. 2(f), the tool 10 is lowered slightly; in other words, it is lowered by the same distance as that the tool 10 has been raised in FIG. 1(d) and FIG. 2(d); then, as shown in FIG. 1(g) and FIG. 2(g), a load and ultrasonic waves are applied to the tool 10 so that the lead 2 and pad 6 are bonded together.

Figure 1H:
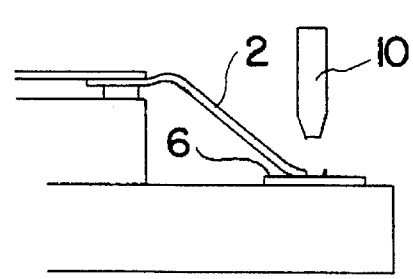

Following the completion of this bonding action, the tool 10 is raised and returned to its initial position as shown in FIG. 1(h) and FIG. 2(h), thus completing one cycle of bonding.

As seen from the above, the lead 2 is bonded by the tool 10 after being deformed into substantially an "S" shape, which has a certain degree of slack. Accordingly, any stress applied to the lead 2 can be absorbed. Furthermore, since the lead 2 can thus be shaped into a stress-absorbing shape by merely moving the tool 10 in the bonding process, there is no need to use a shaping die or to perform such shaping in a separate process. Accordingly, manufacturing costs can be reduced.

In the embodiment described above, the lead 2 connected to the chip 3 is bonded to the pad 6 on the circuit board 5. However, the invention can be further applied in cases where the free ends of leads 2 are bonded to the pads 4 of the chip 3 wherein the chip 3 is not connected to the leads 2 as described above. In this case, the reference numeral 5 in FIG. 1 refers to a chip and 6 to the pads of the chip.

As described in detail in the above, pressure scars are formed in the free end portions of leads by a bonding tool, and then the leads are bonded to pads after the tool is caused to catch on the irregular portions of the pressure scars and is caused to move toward the free end portions of the leads. Accordingly, shaping of the leads can be performed without using a shaping die or a separate shaping process. Thus, the reduction of manufacturing costs can be accomplished.

We claim:

1. A single point bonding method wherein leads connected to a pad of a chip are individually connected to a pad of a circuit board by means of a bonding tool or leads of a chip are individually connected to a pad of a chip by means of a bonding tool, wherein a pressure scar is formed on a free end portion of each lead by means of said bonding tool, said bonding tool is caused to catch on irregular portions of said pressure scar and is moved toward a fixed end of said lead, and then said lead is bonded to said pad of said circuit board or to said pad of said chip.

2. A single point bonding method wherein leads are individually connected to a pad by means of a bonding tool, said method comprising:

forming a pressure scar at a free end portion of each of said leads by said bonding tool;

causing said bonding tool to catch on an irregular portion of said pressure scar;

moving said bonding tool toward a fixed end of said lead thus forming said lead into a curved shape; and bonding said lead to said pad by said bonding tool.

3. A single point bonding method according to claim 3, wherein said method uses a bonding tool which is provided with an uneven pattern on an end surface thereof.

4. A single point bonding method wherein leads of a pad of a chip are individually connected to a pad of a circuit board by a bonding tool or leads of a chip are individually connected to a pad of a chip by a bonding tool, wherein said method comprising the steps of:

lowering said bonding tool, thus bringing an under surface of said bonding tool to come into contact with an end portion of one of said leads;

further lowering said bonding tool, thus bringing said end portion of said one of said lead to come into contact with said pad;

pressing said end portion of said one of said leads by said under surface of said bonding tool, thus forming an uneven pattern at said end portion of said one of said leads;

raising said bonding tool so that said uneven pattern is caught by said under surface of said bonding tool;

moving said bonding tool toward a fixed end of said one of said leads so as to bend said one of said leads; and bonding said one of said leads to said pad.

* * * * *